United States Patent
Fujisawa

(10) Patent No.: US 7,612,579 B2
(45) Date of Patent: Nov. 3, 2009

(54) OUTPUT CIRCUIT OF SEMICONDUCTOR DEVICE AND SEMICONDUCTOR DEVICE INCLUDING THEREOF

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/889,837

(22) Filed: Aug. 16, 2007

(65) Prior Publication Data

US 2008/0054936 A1 Mar. 6, 2008

(30) Foreign Application Priority Data

Aug. 29, 2006 (JP) .............................. 2066-231694

(51) Int. Cl.
*H03K 19/003* (2006.01)
(52) U.S. Cl. .......................................... 326/30; 326/28
(58) Field of Classification Search .................. 326/26, 326/27, 30, 86, 87; 327/108, 109; 365/189.05, 365/189.11, 233.1
See application file for complete search history.

(56) References Cited

U.S. PATENT DOCUMENTS

2004/0090239 A1* 5/2004 Ikeoku et al. ................. 326/30
2006/0158214 A1* 7/2006 Janzen et al. ................. 326/30
2006/0158216 A1* 7/2006 Aoyama et al. ............... 326/30

FOREIGN PATENT DOCUMENTS

JP       2003-133943 A       5/2003

* cited by examiner

*Primary Examiner*—James H. Cho
*Assistant Examiner*—Jany Tran
(74) *Attorney, Agent, or Firm*—Foley & Lardner LLP

(57) ABSTRACT

An output circuit includes a counter circuit that generates an ODT control signal ODTa, plural driver circuits having the ODT function, a synchronizing circuit that synchronizes a signal transmitted from the counter circuit to the driver circuit with an internal clock DLL, a first selecting circuit that activates one of plural ODT selection signals ODTb and ODTc based on the ODT control signal ODTa, and a second selecting circuit that selects a driver circuit to be used out of the plural driver circuits based on the activated ODT selection signal. The first selecting circuit is provided between the counter circuit and the synchronizing circuit, and the second selecting circuit is provided between the synchronizing circuit and the driver circuit.

15 Claims, 7 Drawing Sheets

US 7,612,579 B2

OUTPUT CIRCUIT OF SEMICONDUCTOR DEVICE AND SEMICONDUCTOR DEVICE INCLUDING THEREOF

TECHNICAL FIELD

The present invention relates to an output circuit of a semiconductor device and a semiconductor device including thereof. Particularly, the present invention relates to an output circuit having an ODT (On Die Termination) function and a semiconductor device including this output circuit. The present invention also relates to a data processing system that includes a semiconductor memory device having an output circuit.

BACKGROUND OF THE INVENTION

When plural chips are connected in parallel to an external bus, like in a DRAM (Dynamic Random Access Memory), a signal is often reflected by a chip of which output buffer is in a high-impedance state (Hi-Z). When the signal reflection occurs like this, the quality of the signal on the external bus is degraded. Therefore, when a semiconductor device requiring a high data transfer rate, such as a DDR2 SDRAM (Synchronous DRAM), often includes the ODT function that makes the output circuit as a terminal resistor (Japanese Patent Application Laid-open No. 2003-133943).

When the semiconductor device includes the ODT function, the terminal resistor is not necessary on the mother board. Therefore, the number of parts can be decreased, and the reflection of the signal can be prevented effectively. Consequently, the quality of the signal on the external bus can be increased.

In the DDR2 SDRAM, the ODT is functioned when other chip connected to the same bus is carrying the read operation or the write operation, and the ODT is not functioned during other periods. However, when the data transfer rate becomes very high, the signal quality decreases due to the signal reflection that occurs on the chip itself during the write operation. To solve this problem, it is effective to dynamically change over between the ODT impedances between the period when other chip carries out the read operation or the write operation and the period when the chip concerned carries out the write operation.

However, when the ODT impedance can be dynamically changed, the number of circuit stages between a synchronizing circuit that controls the operation timing of a driver circuit and a data input-output terminal increases. This has a problem of the increase in the inherent delay of a DLL (Delayed Lock Loop). The inherent delay of the DLL is a delay amount between the original clock to be synchronized and the clock synchronized with the original clock. An ideal inherent delay of the DLL is one clock. When the number of circuit stages between the synchronizing circuit and the data input-output terminal is large, the inherent delay of the DLL becomes large, therefore, will be subject to the influence of noise.

Moreover, when the ODT impedance can be dynamically changed, the number of circuit stages between the synchronizing circuit and the data input-output terminal may become larger in the ODT path than in the read path. In this case, there arises a problem that the data output timing or in the ODT execution timing can be easily deviated.

Particularly, when a driver circuit for data output and a driver circuit for the ODT are shared, the number of circuit stages between the synchronizing circuit and the data input-output terminal further increases. Therefore, the above problem becomes more serious.

SUMMARY OF THE INVENTION

It is therefore an object of the present invention to provide an improved output circuit capable of dynamically changing the ODT impedance.

Another object of the present invention is to suppress the number of circuit stages provided between a synchronizing circuit and a data terminal (data input-output terminal) in an output circuit capable of dynamically changing the ODT impedance.

The above and other objects of the present invention can be accomplished by an output circuit of a semiconductor device comprising:

a counter circuit that generates an ODT control signal;

a plurality of driver circuits having the ODT function;

a synchronizing circuit that synchronizes a signal transmitted from the counter circuit to the driver circuit with a predetermined clock;

a first selecting circuit that activates one of a plurality of ODT selection signals based on the ODT control signal; and a second selecting circuit that selects one or more driver circuits to be used out of the plurality of driver circuits based on the activated ODT selection signal, wherein the first selecting circuit is provided between the counter circuit and the synchronizing circuit, and the second selecting circuit is provided between the synchronizing circuit and the driver circuit.

At least a part of the plural driver circuits may be the circuit which is activated during the data output not only during the ODT operation. In other words, the driver circuit for data output and the driver circuit for the ODT can be shared.

As explained above, in the present invention, the first selecting circuit is disposed at the pre-stage of the synchronizing circuit. Therefore, the number of circuit stages between the synchronizing circuit and the data terminal can be decreased. Further, not all selecting circuits are disposed at the pre-stage of the synchronizing circuit, but the second selecting circuit having a relatively large circuit scale is disposed at the post-stage of the synchronizing circuit. Therefore, a transfer margin up to the synchronizing circuit can be sufficiently secured.

With this arrangement, the increase in the inherent delay of the DLL can be suppressed, and the number of circuit stages in the read path and the number of circuit stages in the ODT path can easily coincided with each other.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
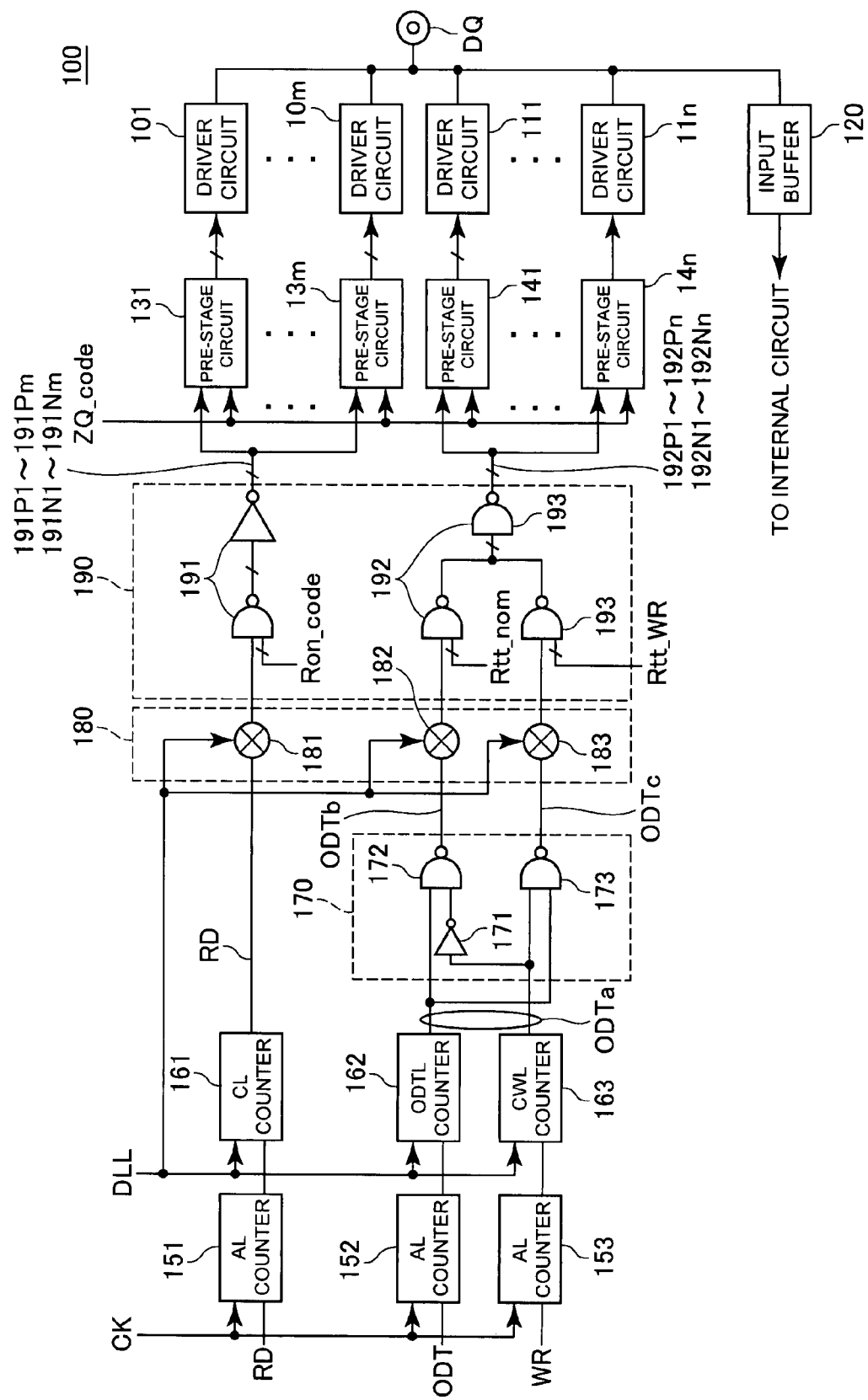
FIG. 1 is a block diagram showing a configuration of an output circuit (input-output circuit) of a semiconductor device according to a first preferred embodiment of the present invention.

FIG. 1 is a block diagram showing a configuration of an output circuit (input-output circuit) 100 of a semiconductor device according to a first preferred embodiment of the present invention.

As shown in FIG. 1, an output circuit 100 according to the present embodiment includes m driver circuits 101 to 10m and n driver circuits 111 to 11n connected in common to a data input-output terminal DQ. Out of these driver circuits, the driver circuits 101 to 10m are output drivers activated during the read operation. On the other hand, the driver circuits 111 to 11n are ODT drivers activated during the ODT operation.

Although not limited thereto, it is preferable that the driver circuits 101 to 10m each have the same impedance, and also preferable that the driver circuits 111 to 11n each have the same impedance. While an input buffer 120 is connected to the data input-output terminal DQ, since the configuration of the input buffer 120 is not directly relevant to the scope of the present invention, its descriptions will be omitted in the specification.

In the output circuit 100 according to the present embodiment, at the time of outputting read data, one or more of the plural driver circuits 101 to 10m are activated simultaneously. Which one or more driver circuits are to be activated is assigned by a code signal Ron_code. In other words, the output impedance is assigned by the code signal Ron_code. The code signal Ron_code can be optionally set by a mode register set.

Similarly, when the ODT function is used, one or more of the plural driver circuits 111 to 11n are activated simultaneously. Which one or more driver circuits are to be activated is assigned by a code signal Rtt_nom or Rtt_WR. The code signal Rtt_nom is a signal that shows an ODT impedance when other chip connected to the same external bus carries out the read operation or the write operation. The code signal Rtt_WR is a signal that shows an ODT impedance when the concerned chip itself carries out the write operation.

The operations of the driver circuits 101 to 10m and 111 to 11n are controlled by pre-stage circuits 131 to 13m and 141 to 14n, respectively. As shown in FIG. 1, an impedance control signal ZQ_code is supplied in common to the pre-stage circuits 131 to 13m and 141 to 14n. The impedance control signal ZQ_code is a signal that fine adjusts the impedances of the driver circuits 101 to 10m and 111 to 11n to desired values.

Figure 2:
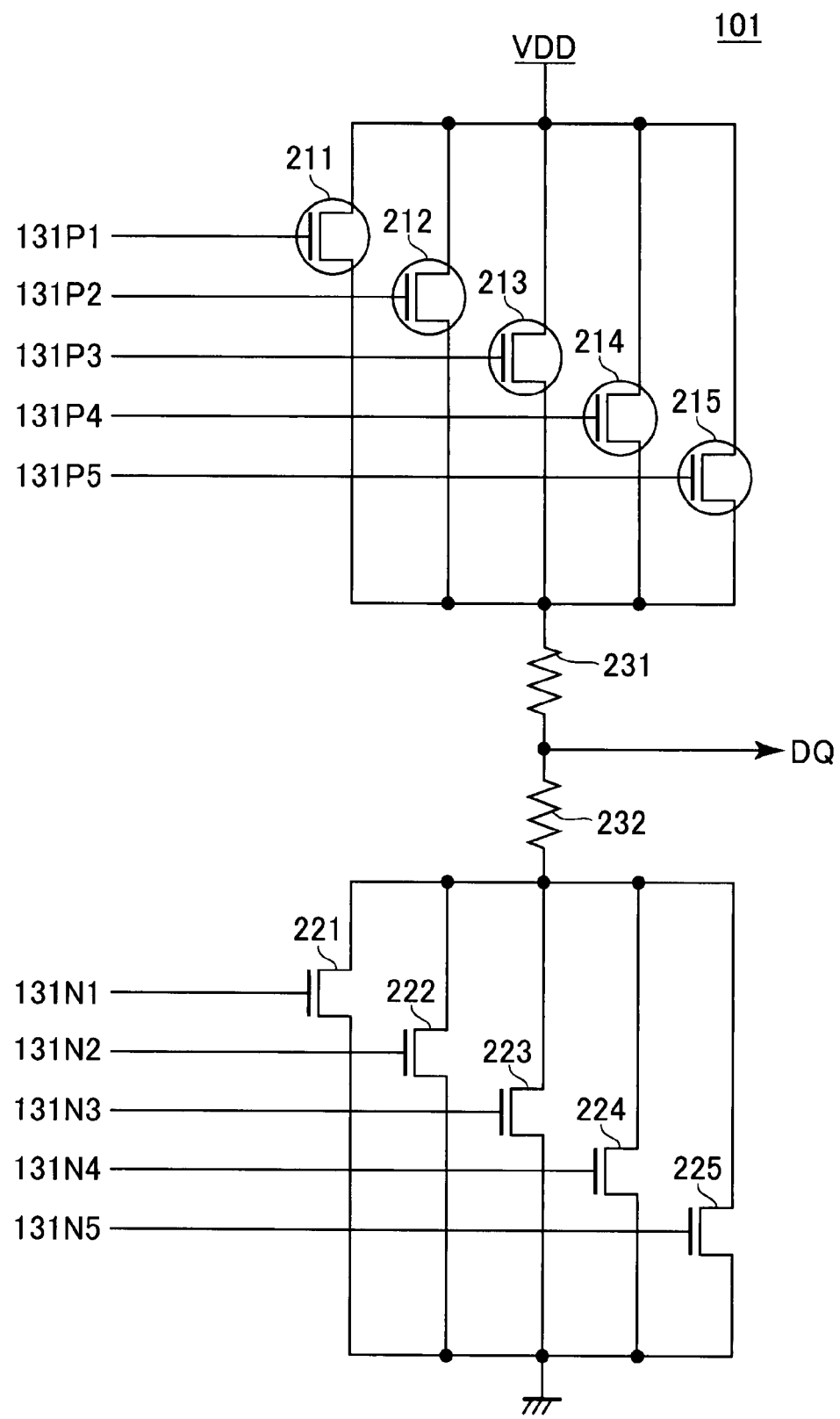
FIG. 2 is a circuit diagram of the driver circuit shown in FIG. 1.

FIG. 2 is a circuit diagram of the driver circuit 101. Since other driver circuits also have similar circuit configurations, redundant explanations thereof will be omitted.

As shown in FIG. 2, the driver circuit 101 includes plural (five, in the present example) P-channel MOS transistors 211 to 215 connected in parallel, plural (five, in the present example) N-channel MOS transistors 221 to 225 connected in parallel, and resistors 231 and 232 connected in series between the transistors 211 to 215 and the transistors 221 to 225. A connection point between the resistor 231 and the resistor 232 is connected to the data input-output terminal DQ.

Five operation signals 131P1 to 131P5 are supplied to the gate electrodes of the transistors 211 to 215. Five operation signals 131N1 to 131N5 are supplied to the gate electrodes of the transistors 221 to 225. The operation signals 131P1 to 131P5 and 131N1 to 131N5 are supplied from the corresponding pre-stage circuit 131, and become at the high level or the low level, respectively. As a result, the ten transistors included in the driver circuit 101 are individually ON/OFF controlled based on the ten operation signals 131P1 to 131P5 and 131N1 to 131N5, respectively.

The parallel circuit including the transistors 211 to 215 and the parallel circuit including the transistors 221 to 225 are designed to become at a predetermined impedance (for example, 120Ω) during the conduction period, respectively. However, the ON resistance of the transistors varies depending on manufacturing conditions, and varies depending on environmental temperatures and power supply voltages during the operation. Therefore, a desired impedance cannot always be obtained. Accordingly, in order to set the actual impedance to a desired value, the number of transistors to be turned on needs to be adjusted. To achieve this object, the parallel circuits including plural transistors are used.

In order to fine adjust the impedance over a broad range, it is preferable that the W/L ratios (the gate width/gate length ratio) of the plural transistors constituting the parallel circuit are mutually differentiated. Particularly, it is preferable to add weights of the power of two to the W/L ratios. Taking this point into consideration, in the present embodiment, when the W/L ratio of the transistor 211 is "1", the W/L ratios of the transistors 212 to 215 are set to "2", "4", "8", and "16", respectively. The values of the W/L ratios are relative values, and do not represent actual W/L ratios. This is similarly applied hereinafter. Accordingly, by suitably selecting transistors to be turned on using the operation signals 131P1 to 131P5 and 131N1 to 131N5, the on resistance of the parallel circuit can be fixed to substantially a desired value, regardless of the variations of manufacturing conditions and temperature changes.

The resistance value of the resistors 231 and 232 is designed to 120Ω, for example. In this case, at least one of the parallel circuit including the transistors 211 to 215 and the parallel circuit including the transistors 221 to 225 is in the on state, the impedance of the driver circuit 101 as observed from the data input-output terminal DQ becomes 240Ω. A tungsten (W) resistor, for example, can be used for the resistors 231 and 232.

Figure 3:
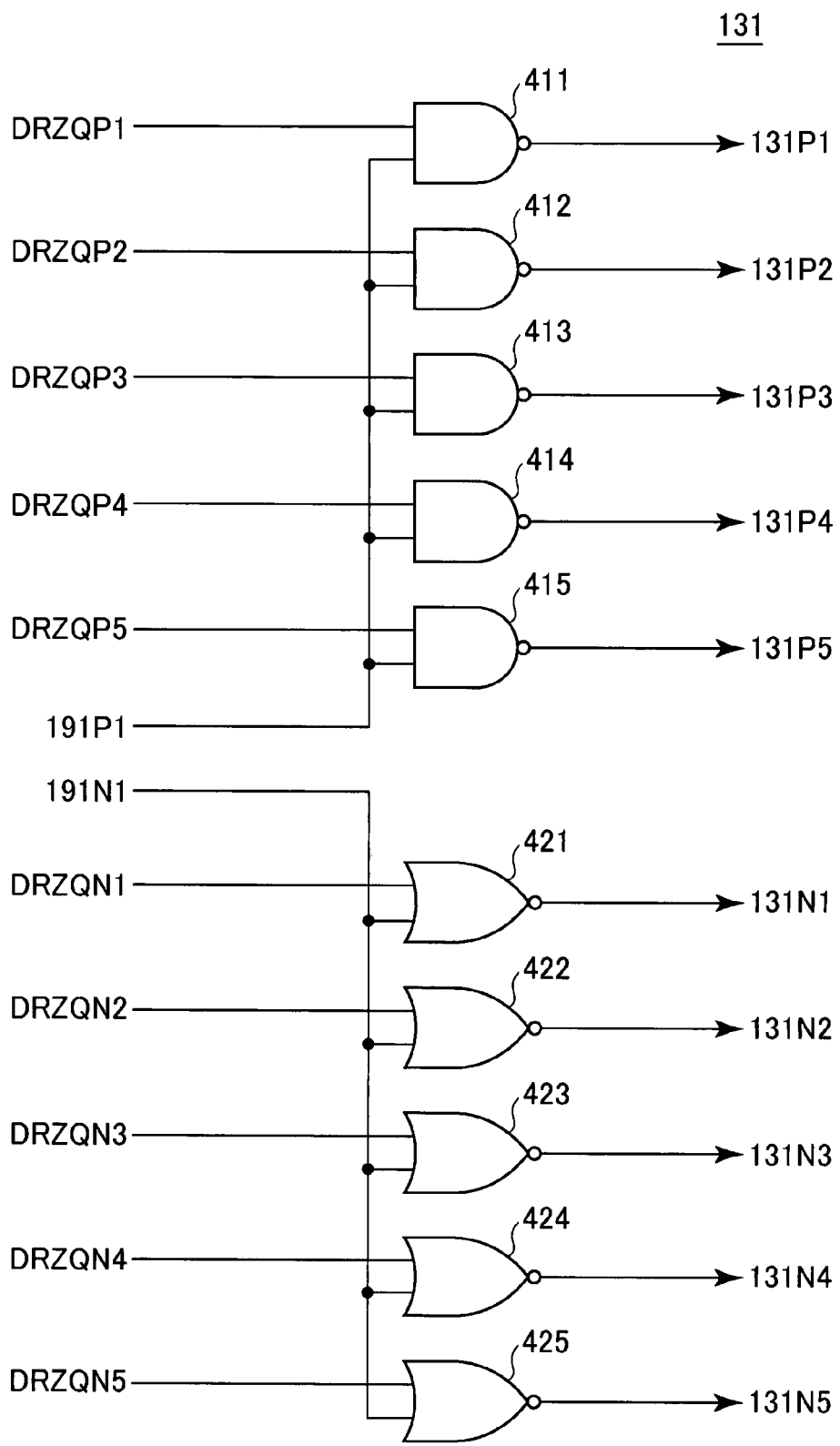
FIG. 3 is a circuit diagram of the pre-stage circuit shown in FIG. 1.

FIG. 3 is a circuit diagram of the pre-stage circuit 131. Since other pre-stage circuits also have similar circuit configurations, redundant explanations thereof will be omitted.

As shown in FIG. 3, the pre-stage circuit 131 includes five NAND circuits 411 to 415 and five NOR circuits 421 to 425. A selection signal 191P1 described later is supplied in common to the NAND circuits 411 to 415. Signals DRZQP1 to DRZQP5 that constitute a part of the impedance control signal ZQ_code are also supplied to the NAND circuits 411 to 415, respectively. On the other hand, a selection signal 191N1 described later is supplied in common to the NOR circuits 421 to 425. Signals DRZQN1 to DRZQN5 that constitute the rest part of the impedance control signal ZQ_code are also supplied to the NOR circuits 421 to 425, respectively.

Although not shown in the drawing, selection signals 191P2 to 191Pm and 191N1 to 191Nm are supplied to the pre-stage circuits 132 to 13m, instead of the selection signals 191P1 to 191N1. Selection signals 192P1 to 192Pn and 192N1 to 192Nn are supplied to the pre-stage circuits 141 to 14n, instead of the selection signals 191P1 to 191N1.

The operation signals 131P1 to 131P5 as the outputs of the NAND circuits 411 to 415 and the operation signals 131N1 to 131N5 as the outputs of the NOR circuits 421 to 425 are supplied to the driver circuit 101, as shown in FIG. 2, and are used to control the corresponding transistors, respectively.

Referring to FIG. 1 again, the output circuit 100 according to the present embodiment includes AL counters 151 to 153. The AL counters 151 to 153 are circuits that count additive latencies. Each AL counter is supplied with a read signal RD, an ODT operation signal ODT, and a write signal WR. An external clock CK is used for the count clocks of the AL counters 151 to 153.

The read signal RD is used to control the output timing of the read data read out from the memory cell during the read operation. On the other hand, the ODT operation signal ODT is a signal activated (set to the high level) at a predetermined timing during the ODT operation. The write signal WR is a signal activated (set to the high level) at a predetermined timing during the write operation.

The outputs of the AL counters 151 to 153 are supplied to a CL counter 161, an ODTL counter 162, and a CWL counter 163, respectively. The CL counter 161 is a circuit that counts the CAS latencies. The ODTL counter 162 is a circuit that counts the ODT latencies. The CWL counter 163 is a circuit that counts the CAS write latencies. An internal clock DLL is used as the counter clock in each counter. The internal clock DLL is a clock that is synchronized with the external clock CK by a DLL circuit (not shown).

The read signal RD, the ODT operation signal ODT, and the write signal WR are signals of which latencies are mutually different. Therefore, at the stage after these signals pass the AL counters 151 to 153, the timings of these signals are not coincided. The timings of these signals coincide with each other for the first time after the signals pass the CL counter 161, the ODTL counter 162, and the CWL counter 163.

The output of the CL counter 161 is supplied as it is to a synchronizing circuit 181. On the other hand, the outputs of the ODTL counter 162 and the CWL counter 163 are supplied to synchronizing circuits 182 and 183 via a first selecting circuit 170. The outputs of the ODTL counter 162 and the CWL counter 163 are signals concerning the ODT operation. In FIG. 1, these signals are expressed as an ODT control signal ODTa.

The first selecting circuit 170 includes an inverter 171, and NAND gates 172 and 173. The output of the ODTL counter 162 and an inverted signal of the output of the CWL counter 163 are supplied to the NAND gate 172. On the other hand, the output of the ODTL counter 162 and the output of the CWL counter 163 are supplied to the NAND gate 173.

Accordingly, when the ODT operation signal ODT becomes at the high level, one of ODT selection signals ODTb and ODTc as the outputs of the NAND gates 172 and 173 is activated (set to the low level) based on a logic value of the write signal WR. Specifically, when the ODT operation signal ODT is at the high level and also when the write signal WR is at the low level, the ODT selection signal ODTb is activated (set to the low level). On the other hand, when the ODT operation signal ODT is at the high level and also when the write signal WR is at the high level, the ODT selection signal ODTc is activated (set to the low level).

A synchronizing circuit group 180 is a circuit that outputs the input signal synchronously with the internal clock DLL. The synchronizing circuit group 180 includes synchronizing circuits 181 to 183 provided corresponding to the read signal RD, and the ODT selection signal ODTb and ODTc, respectively. The synchronizing circuits 181 to 183 are positioned closest to the data input-output terminal DQ, and are used to finally control the operation timings of the driver circuits 101 to 10m and 111 to 11n.

Therefore, it is desirable that the number of circuit stages between the synchronizing circuits 181 to 183 and the data input-output terminal DQ is as small as possible. It is also desirable that the number of circuit stage of each path coincide with each other. This is because when the number of circuit stages between the synchronizing circuits 181 to 183 and the data input-output terminal DQ is large, the intrinsic delay of the DLL becomes large, and this has easily the influence of noise. When the numbers of the circuit stages of the paths do not coincide with each other, a deviation easily occurs in the data output timing and the ODT execution timing.

The read signal RD and the ODT selection signals ODTb and ODTc synchronized by the synchronizing circuit group 180 are all supplied to a second selecting circuit 190. The second selecting circuit 190 is a circuit that is used to select a driver circuit to be used, out of the plural driver circuits 101 to 10m and 111 to 11n. The second selecting circuit 190 selects the output impedance or the ODT impedance based on the code signal.

Specifically, the second selecting circuit 190 includes a gate circuit 191 to which the read signal RD and the code signal Ron_code are supplied. When the read signal RD is activated, the gate circuit 191 activates corresponding one or more of the pre-stage circuits 131 to 13m, based on the code signal Ron_code. In other words, the code signal Ron_code is an m-bit (2m-bit when a complementary signal is used) signal. The gate circuit 191 activates the pre-stage circuits 131 to 13m corresponding to the active bit (or a bit pair).

Figure 4:
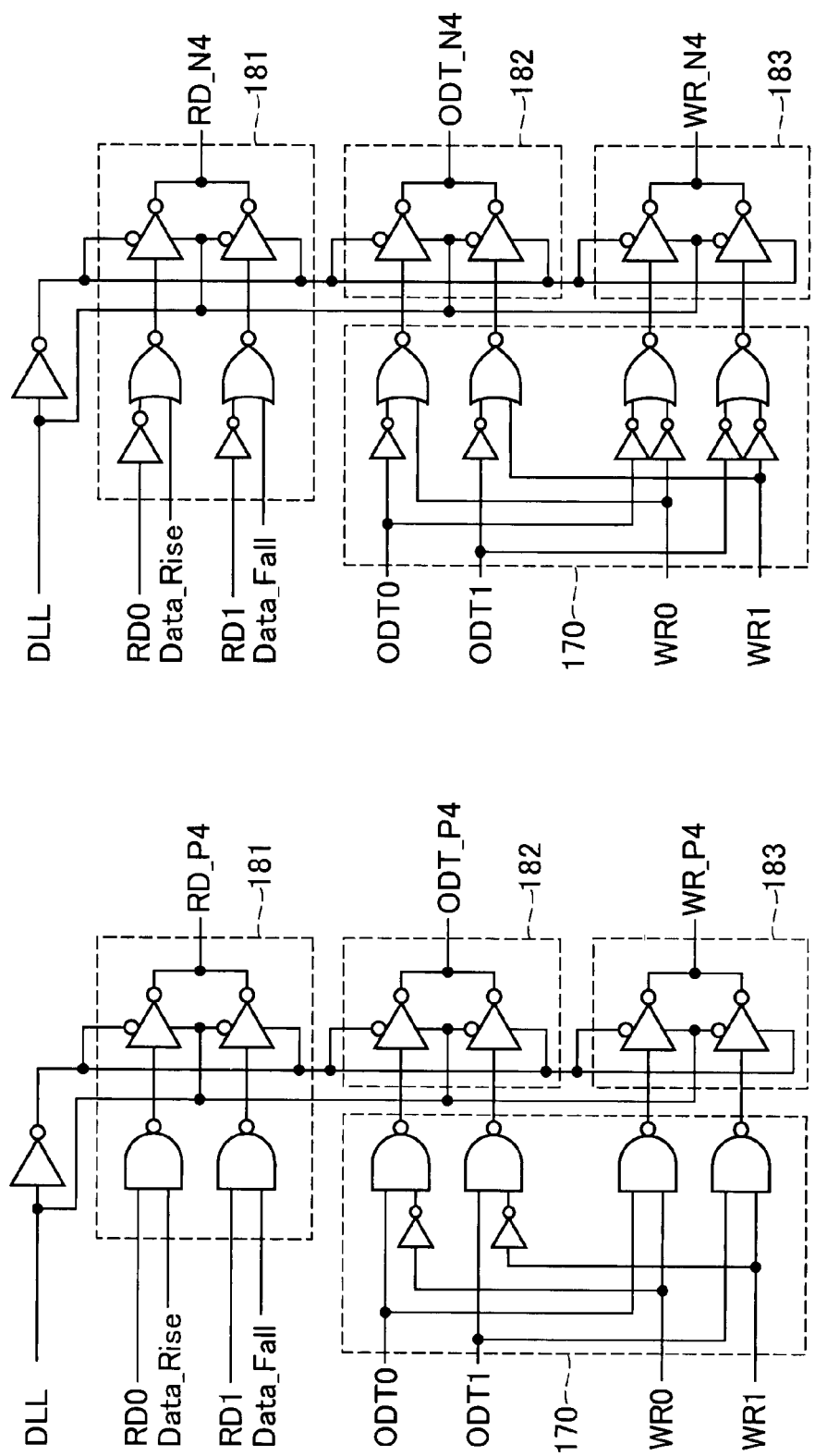
FIG. 4 is a circuit diagram showing a further detailed configuration of the first selecting circuit and the synchronizing circuit group shown in FIG. 1.

FIG. 4 is a circuit diagram showing a further detailed configuration of the first selecting circuit 170 and the synchronizing circuit group 180.

As shown in FIG. 4, in the present embodiment, the read signal RD as the output of the CL counter 161 includes two signals RD0 and RD1. Similarly, the output of the ODTL counter 162 includes two signals ODT0 and ODT1, and the output of the CWL counter 163 includes two signals WR0 and WR1. The outputs of the synchronizing circuits 181 to 183 include two signals RD_P4 and RD_N4, ODT_P4 and ODT_N4, and WR_P4 and WR_N4, respectively.

As shown in FIG. 4, read data Data_Rise and Data_Fall are supplied to the synchronizing circuit 181. The read data Data_Rise and Data_Fall are supplied from a FIFO not shown.

The pre-stage circuits 131 to 13m are activated as follows.

First, when the logic level of the read signal RD is the high level, out of the selection signals 191P1 to 191Pm, a selection signal corresponding to the code signal Ron_code is set to the low level, and other selection signals are set to the high level. All the selection signals 191N1 to 191Nm are set to the low level. As a result, the pre-stage circuit in which the corresponding selection signals 191P1 to 191Pm are at the low level become in the active state.

The activated pre-stage circuit outputs the operation signals (131P1 to 131P5 in the pre-stage) having the same codes as the signals DRZQP1 to DRZQP5 as a part of the control signal ZQ_code.

On the other hand, when the logic level of the read signal RD is the low level, out of the selection signals 191N1 to 191Nm, a selection signal corresponding to the code signal Ron_code is set to the high level, and other selection signals are set to the low level. All the selection signals 191P1 to 191Pm are set to the high level. As a result, the pre-stage circuit in which the corresponding selection signals 191N1 to 191Nm are at the low level become in the active state.

The activated pre-stage circuit outputs the operation signals (131N1 to 131N5 in the pre-stage) having the same codes as the signals DRZQN1 to DRZQN5 as a part of the control signal ZQ_code.

On the other hand, in the non-activated pre-stage circuit, all the operation signals (131P1 to 131P5) at the P-channel side are fixed to the high level, and all the operation signals (131N1 to 131N5) at the N-channel side are fixed to the low level.

The gate circuit 191 shown in FIG. 1 is denoted using a symbol mark indicating the AND gate. This symbol mark is used to schematically express the function that when the read signal RD is activated, the gate circuit 191 outputs the code signal Ron_code or a signal corresponding to this. This does not mean that the gate circuit 191 actually includes only the AND gate. Therefore, when 2m-bit complementary signals are used as the code signal Ron_code, a logic circuit group that passes or interrupts these signals based on the read signal RD is used for the gate circuit 191, as described later.

The second selecting circuit 190 also includes a gate circuit 192 to which the ODT selecting signal ODTb and the code signal Rtt_nom are supplied. The gate circuit 192 includes a function similar to that of the gate circuit 191. When the ODT selection signal ODTb is activated, the gate circuit 192 activates corresponding one or more of the pre-stage circuits 141 to 14n, based on the code signal Rtt_nom. In other words, the code signal Rtt_nom is an n-bit (2n-bit when a complementary signal is used) signal. The gate circuit 192 activates the pre-stage circuits 141 to 14n corresponding to the active bit (or a bit pair).

The ODT selection signal ODTb and the ODT selection signal ODTc are not activated simultaneously. Therefore, when the ODT selection signal ODTb is activated, the code signal Rtt_WR is not affected at all.

The pre-stage circuits 141 to 14n are activated by setting selection signals corresponding to the code signal Rtt_nom to the low level out of the selection signals 192P1 to 192Pn, with the rest of the selection signals set to the high level, and by setting selection signals corresponding to the code signal Rtt_nom to the high level out of the selection signals 192N1 to 192Nn, with the rest of the selection signals set to the low level. With this arrangement, the activated pre-stage circuit outputs the operation signal having the same code as the control signal ZQ_code.

The gate circuit 192 shown in FIG. 1 is denoted using a symbol mark indicating the two-stage NAND gate. This symbol mark is used to schematically express the function that when the ODT selection signal ODTb is activated, the gate circuit 192 outputs the code signal Rtt_nom or a signal corresponding to this. This does not mean that the gate circuit 192 actually includes only the NAND gate. Therefore, when 2n-bit complementary signals are used as the code signal Rtt_nom, a logic circuit group that passes or interrupts these signals corresponding to the ODT selection signal ODTb is used for the gate circuit 192, as described later.

Further, the second selecting circuit 190 includes a gate circuit 193 to which the ODT selection signal ODTc and the code signal Rtt_WR are supplied. The gate circuit 193 has the function similar to those of the gate circuits 191 and 192. When the ODT selection signal ODTc is activated, the gate circuit 193 activates corresponding one or more of the pre-stage circuits 141 to 14n, based on the code signal Rtt_WR. In other words, the code signal Rtt_WR is also an n-bit (2n-bit when a complementary signal is used) signal. The gate circuit 193 activates the pre-stage circuits 141 to 14n corresponding to the active bit (or a bit pair).

As described above, the ODT selection signal ODTb and the ODT selection signal ODTc are not activated simultaneously. Therefore, when the ODT selection signal ODTc is activated, the code signal Rtt_nom is not affected at all.

As described above, the gate circuit 193 shown in FIG. 1 is denoted using a symbol mark indicating the two-stage NAND gate. This symbol mark is used to schematically express the function that when the ODT selection signal ODTc is activated, the gate circuit 193 outputs the code signal Rtt_WR or a signal corresponding to this. This does not mean that the gate circuit 193 actually includes only the NAND gate. Therefore, when 2n-bit complementary signals are used as the code signal Rtt_WR, a logic circuit group that passes or interrupts these signals corresponding to the ODT selection signal ODTc is used for the gate circuit 193, as described later.

Figure 5:
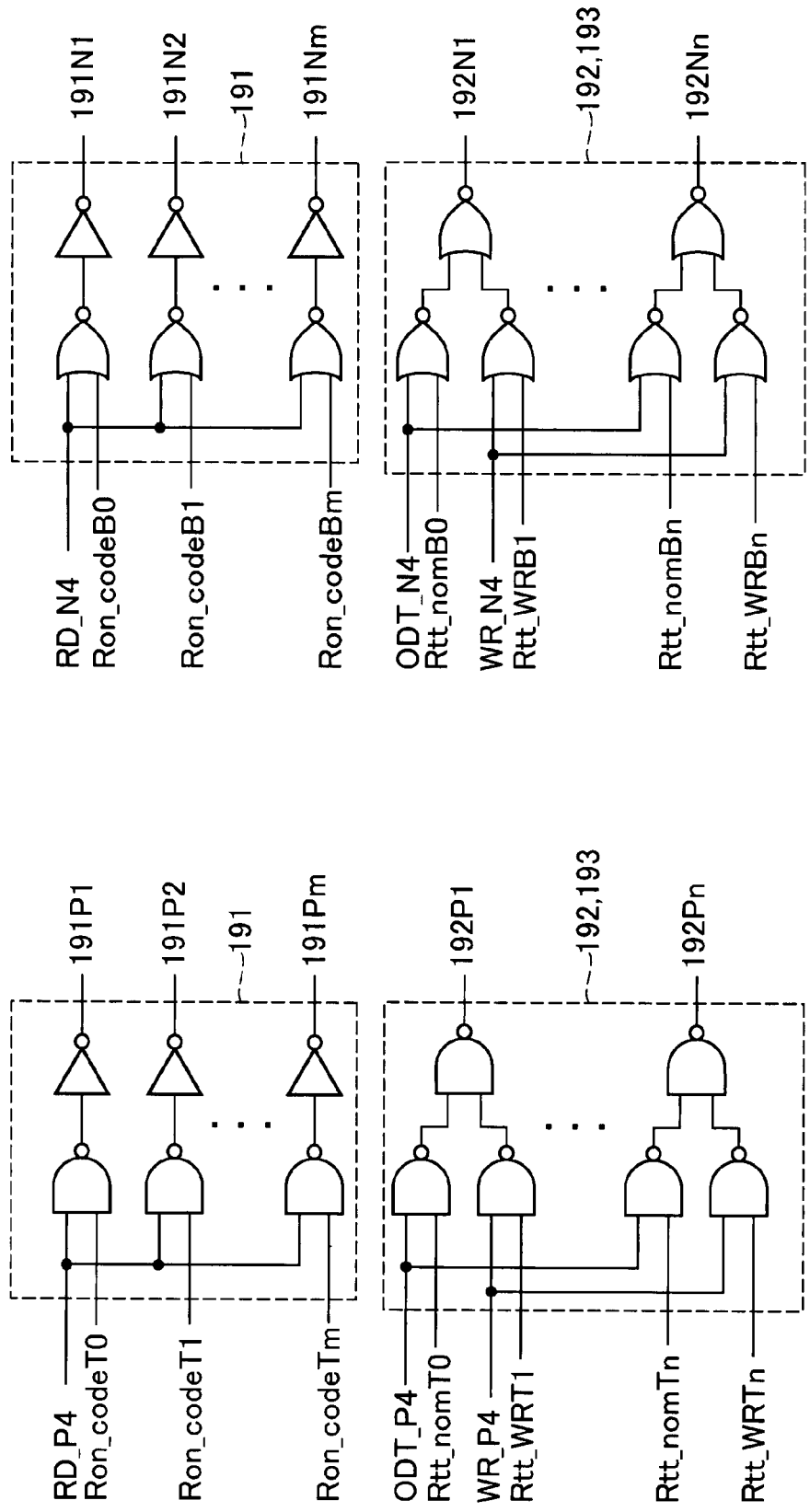
FIG. 5 is a circuit diagram showing further details of the second selecting circuit shown in FIG. 1.

FIG. 5 is a circuit diagram showing further details of the second selecting circuit 190.

As shown in FIG. 5, complementary (for example, Ron_codeT0 and Ron_codeB0) signals are used for each code signal. A true signal (T) is supplied to a corresponding NAND gate, and a bar signal (B) is supplied to a corresponding NOR gate. Based on these circuit configurations, the gate circuit 191 can pass or interrupt the code signal Ron_code based on the read signals RD (RD_P4, RD_N4). Similarly, the gate circuit 192 can pass or interrupt the code signal Rtt_nom based on the ODT selection signals ODTb (ODT_P4, ODT_N4). The gate circuit 193 can pass or interrupt the code signal Rtt_WR based on the ODT selection signals ODTc (WR_P4, WR_N4).

The configuration of the output circuit 100 according to the present embodiment is as explained above. The operation of the output circuit according to the embodiment is explained next.

The read operation is explained first.

During the read operation, the read signal RD is activated at a predetermined timing, and the read signal RD is input to the synchronizing circuit 181 via the counter 151 and the CL counter 161. The synchronizing circuit 181 synchronizes the read signal RD with the internal clock DLL, and supplies the synchronized read signal RD to the gate circuit 191 included in the second selecting circuit 190. Based on this, one or more of the driver circuits 101 to 10m operate, and the data input-output terminal DQ is driven to the high level or the low level based on the logic value of the read signal RD.

In this case, the output impedance is determined depending on how many driver circuits 101 to 10m are activated. For example, when all the impedances of the driver circuits 101 to 10m are 240Ω (a value after calibration by ZQ_code) the output impedance becomes 240Ω when one only driver circuit is used, and the output impedance becomes 120Ω when two driver circuits are used in parallel. In other words, when the number of driver circuits used is x ($\leq$m), the output impedance becomes (240/x)Ω.

As described above, which driver circuits 101 to 10m are used is determined by the code signal Ron_code. Because the code signal Ron_code can be changed by the mode register set, a desired output impedance can be obtained.

The ODT operation is explained next.

The output circuit according to the present embodiment can dynamically change the ODT impedance. In other words, the ODT impedance when other chip connected to the same external bus carries out the read operation or the write operation and the ODT impedance when the chip concerned carries out the write operation can be dynamically changed over.

First, the ODT operation when other chip connected to the same external bus carries out the read operation or the write operation is explained.

In the present operation, the ODT signal ODT is activated at a predetermined timing. The activated ODT signal ODT is input to the first selecting circuit 170 via the AL counter 152 and the ODTL counter 162. In this case, because the write signal WR is inactive, the first selecting circuit 170 activates the ODT selection signal ODTb.

The ODT selection signal synchronized with the internal clock DLL by the synchronizing circuit, 182 is supplied to the gate circuit 192 included in the second selecting circuit 190. Based on this, one or more of the driver circuits 111 to 11*n* operate, and the data input-output terminal DQ functions as a terminal resistor having a predetermined impedance.

In this case, the ODT impedance is determined depending on how many driver circuits 111 to 11*n* are activated. For example, when all the impedances of the driver circuits 111 to 11*n* are 120Ω (a value after calibration by ZQ_code), the ODT impedance becomes 120Ω when one only driver circuit is activated, and the ODT impedance becomes 60Ω when two driver circuits are activated in parallel. In other words, when the number of driver circuits activated is y ($\leq$n), the ODT impedance becomes (120/y)Ω.

As described above, how many driver circuits 111 to 11*n* are used is determined by the code signal Rtt_nom. Because the code signal Rtt_nom can be changed by the mode register set, a desired ODT impedance can be obtained.

One impedance to be used in the ODT operation is selected from a predetermined group of impedances. For example, when five kinds of ODT impedances of 120Ω, 60Ω, 40Ω, 30Ω, and 20Ω are assumed, the code signal Rtt_nom indicating any one of the five kinds of impedances is set by the mode register set.

On the other hand, when the chip concerned carries out the write operation, the ODT signal ODT is activated at a predetermined timing, and the write signal WR is activated. The ODT signal ODT is input to the first selecting circuit 170 via the AL counter 152 and the ODTL counter 162. The write signal WR is input to the first selecting circuit 170 via the AL counter 153 and the CWL counter 163.

As described above, the timing of the ODT signal ODT and the timing of the write signal WR coincide with each other after these signals pass the ODTL counter 162 and the CWL counter 163. The ODT control signal ODTa as the output of these signals becomes at the high level. With this arrangement, the first selecting circuit 170 activates the ODT selection signal ODTc.

The ODT selection signal ODTc synchronized with the internal clock DLL by the synchronizing circuit 183 is supplied to the gate circuit 193 included in the second selecting circuit 190. Based on this, one or more of the driver circuits 111 to 11*n* operate. Which one or more driver circuits 111 to 11*n* are used is determined by the code signal Rtt_WR. Because the code signal Rtt_WR can be also changed by the mode register set, a desired ODT impedance can be obtained.

One impedance to be used in the ODT operation is selected from a predetermined group of impedances. For example, when two kinds of ODT impedances of 120Ω and 60Ω are assumed, the code signal Rtt_WR indicating any one of the two kinds of impedances is set by the mode register set.

As described above, during the ODT operation, the ODT impedance changes depending on whether the write signal WR is activated. In other words, when the write signal is not activated, the ODT impedance determined by the code signal Rtt_nom is obtained. When the write signal WR is activated, the ODT impedance determined by the code signal Rtt_WR is obtained. With this arrangement, not only when other chip connected to the same external bus carries out the read operation or the write operation, but also when the chip concerned carries out the write operation, reflection of the signal can be effectively suppressed.

Further, in the present embodiment, because the first selecting circuit 170 is disposed at the pre-stage of the synchronizing circuit group 180, the increase in the number of circuit stages between the synchronizing circuit group 180 and the data input-output terminal DQ can be suppressed.

That is, when the first selecting circuit 170 is disposed at the latter stage of the synchronizing circuit group 180 or when the second selecting circuit 190 includes the function of the first selecting circuit 170, the number of circuit stages between the synchronizing circuit group 180 and the data input-output terminal DQ increases, resulting in the increase in the inherent delay of the DLL. On the other hand, in the present embodiment, the first selecting circuit 170 disposed at the pre-stage of the synchronizing circuit group 180 selects either the ODT operation based on the code signal Rtt_nom or the ODT operation based on the code signal Rtt_WR. Further, the second selecting circuit 190 disposed at the latter stage of the synchronizing circuit group 180 selects the driver circuits 111 to 11*n* based on the actual code signal Rtt_nom or the code signal Rtt_WR.

In other words, either the ODT impedance group (the five kinds of 120Ω, 60Ω, 40Ω, 30Ω, and 20Ω in the above example) that can be selected based on the code signal Rtt_nom or the ODT impedance group (the two kinds of 120Ω and 60Ω in the above example) that can be selected based on the code signal Rtt_WR are selected. Further, the actual ODT impedance is selected from the selected ODT impedance group, based on the code signal Rtt_nom or the code signal Rtt_WR. The first selecting circuit 170 carries out the above first selection operation, and the second selecting circuit 190 carries out the latter selection operation.

Because the number of circuit stages of the path (ODT path) between the synchronizing circuits 182 and 183 and the data input-output terminal DQ is small, the number of circuit stages can be easily coincided with the number of circuit stages of the path (read path) between the synchronizing circuit 181 and the data input-output terminal DQ.

It is considered possible to dispose not only the first selecting circuit 170, but also the second selecting circuit 190 at the pre-stage of the synchronizing circuit group 180. However, because the second selecting circuit 190 has a larger circuit scale than that of the first selecting circuit 170, when the second selecting circuit 190 is disposed at the pre-stage of the synchronizing circuit group 180, there is a risk of the occurrence of shortage of the transfer margin up to the synchronizing circuit group 180. In the present invention, the second selecting circuit 190 is disposed at the latter stage of the synchronizing circuit group 180, by taking this point into consideration.

A second preferred embodiment of the present invention is explained next.

Figure 6:
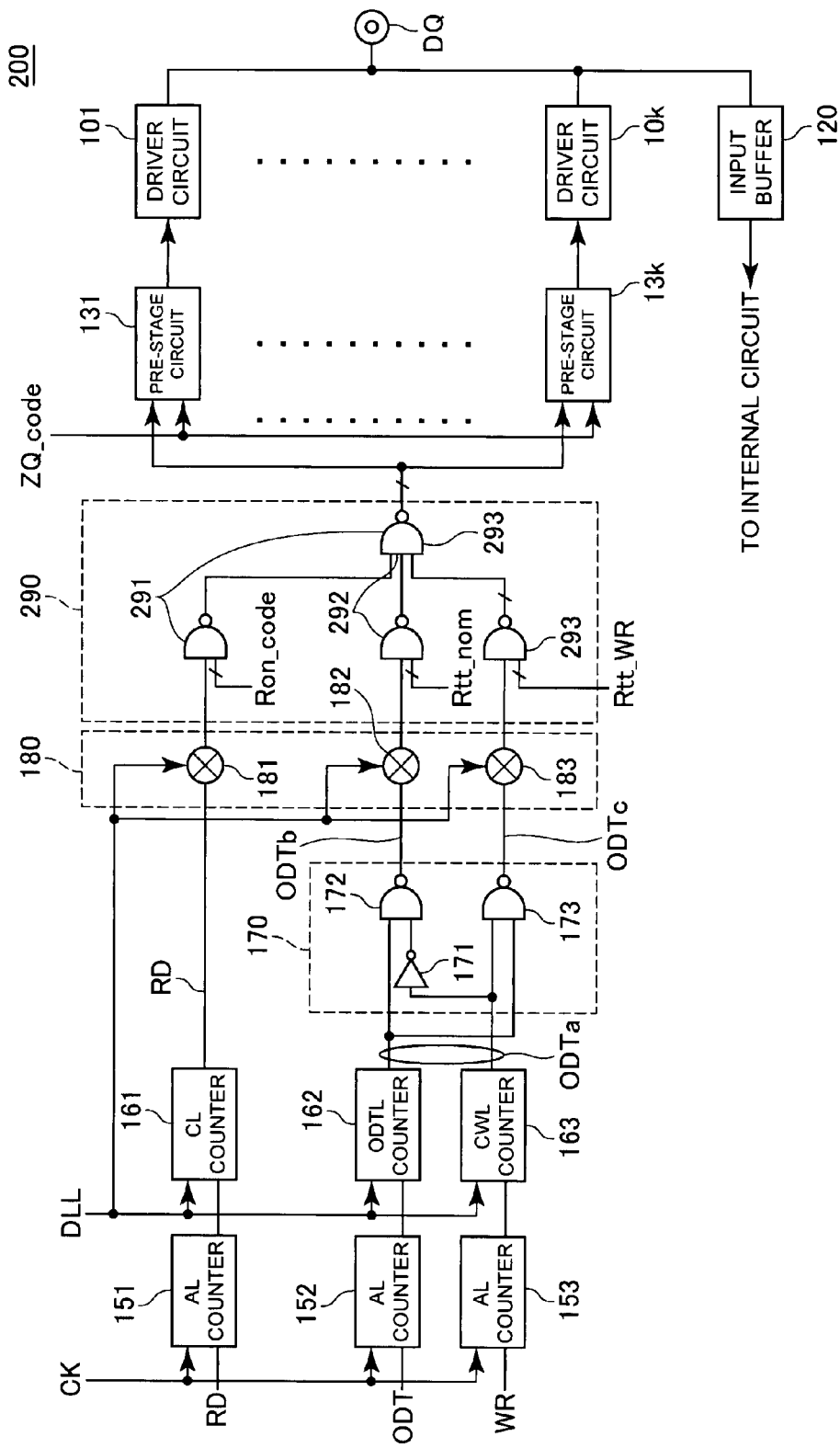
FIG. 6 is a block diagram showing a configuration of an output circuit (input-output circuit) of a semiconductor device according to the second preferred embodiment.

FIG. 6 is a block diagram showing a configuration of an output circuit (input-output circuit) 200 of a semiconductor device according to the second preferred embodiment.

As shown in FIG. 6, the output circuit 200 according to the present embodiment is different from the output circuit 100 shown in FIG. 1 in that the configuration of a second selecting circuit of the output circuit 200 is different from that of the output circuit 100, and that a common driver circuit and a pre-stage circuit carry out the data output operation and the ODT operation.

A second selecting circuit 290 includes a gate circuit 291 corresponding to the read signal RD, a gate circuit 292 corresponding to the ODT selecting circuit ODTb, and a gate circuit 293 corresponding to the ODT selection signal ODTc. These gates circuits 291 to 293 are denoted using a symbol mark indicating a two-stage NAND gate. This symbol mark is used to schematically express the function of each gate circuit, and does not mean that the gate circuits actually include only the NAND gate.

When the read signal RD is activated, the gate circuit 291 outputs the code signal Ron_code or a signal corresponding to this, and activates one or more of the driver circuits 101 to 10k via the pre-stage circuits 131 to 13k. When the ODT selection signal ODTb is activated, the gate circuit 292 outputs the code signal Rtt_nom or a signal corresponding to this, and activates one or more of the driver circuits 101 to 10k via the pre-stage circuits 131 to 13k. When the ODT selection signal ODTc is activated, the gate circuit 293 outputs the code signal Rtt_WR or a signal corresponding to this, and activates one or more of the driver circuits 101 to 10k via the pre-stage circuits 131 to 13k.

As explained above, the present invention can be also applied when the k driver circuits 101 to 10k are used both during the data output operation and during the ODT operation.

As explained above, in the present invention, the first selecting circuit is disposed at the pre-stage of the synchronizing circuit. Therefore, the number of circuit stages between the synchronizing circuit and the data terminal can be decreased. Further, not all selecting circuits are disposed at the pre-stage of the synchronizing circuit, but the second selecting circuit having a relatively large circuit scale is disposed at the post-stage of the synchronizing circuit. Therefore, a transfer margin up to the synchronizing circuit can be sufficiently secured.

With this arrangement, the increase in the inherent delay of the DLL can be suppressed, and the number of circuit stages in the read path and the number of circuit stages in the ODT path can easily coincided with each other.

The present invention can preferably apply to the semiconductor memory device, especially a DRAM.

Figure 7:
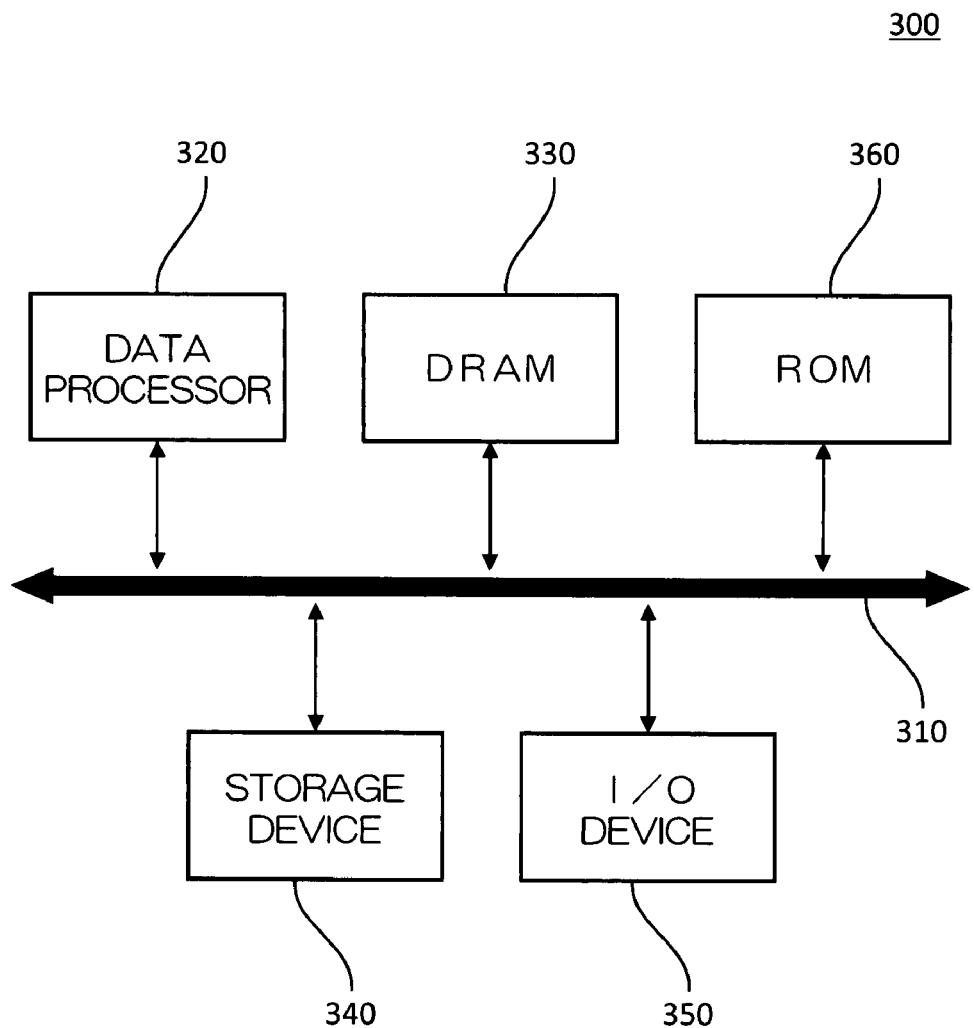
FIG. 7 is a block diagram showing a data processing system using the DRAM that the present invention is applied.

FIG. 7 is a block diagram showing a configuration of a data processing system 300 using a semiconductor memory device according to a preferred embodiment of the present invention. The semiconductor memory device according to the present embodiment is a DRAM.

The data processing system 300 shown in FIG. 7 includes a data processor 320 and a semiconductor memory device (DRAM) 330 according to the present embodiment connected to each other via a system bus 310. The data processor 320 includes a microprocessor (MPU) and a digital signal processor (DSP) for example. However, the constituent elements of the data processor 320 are not limited to these. In FIG. 7, while the data processor 320 and the DRAM 330 are connected to each other via the system bus 310, to simplify the explanation, the data processor 320 and the DRAM 330 can be connected to each other via a local bus without via the system bus 310.

While only one set of the system bus 310 is drawn to simplify the explanation in FIG. 7, the system bus can be set in series or in parallel via the connector according to need. In the memory system data processing system shown in FIG. 7, a storage device 340, an I/O device 350, and a ROM 360 are connected to the system bus 310. However, these are not necessarily essential constituent elements of the invention.

The storage device 340 includes a hard disk drive, an optical disk drive, and a flash memory. The I/O device 350 includes a display device such as a liquid-crystal display, and an input device such as a keyboard and a mouse. The I/O device 350 may be any one of the input device and the output device. Further, while each one constituent element is drawn in FIG. 7 to simplify the explanation, the number of each constituent element is not limited to one, and may be one or two or more.

The present invention is in no way limited to the aforementioned embodiments, but rather various modifications are possible within the scope of the invention as recited in the claims, and naturally these modifications are included within the scope of the invention.

What is claimed is:

1. An output circuit of a semiconductor device comprising:
   a counter circuit that generates an ODT control signal;
   a plurality of driver circuits having an ODT function;
   a first selecting circuit that activates one of a plurality of ODT selection signals based on the ODT control signal;
   a synchronizing circuit that synchronizes an activated ODT selection signal with a predetermined clock; and
   a second selecting circuit that selects one or more driver circuits to be activated out of the plurality of driver circuits based on the activated ODT selection signal,
   wherein the first selecting circuit is provided between the counter circuit and the synchronizing circuit, and the second selecting circuit is provided between the synchronizing circuit and the driver circuit.

2. The output circuit as claimed in claim 1, wherein the counter circuit operates synchronously with the predetermined clock.

3. The output circuit as claimed in claim 2, wherein the ODT control signal includes a first part indicating whether the ODT function is used or not, and a second part for selecting an ODT impedance.

4. The output circuit as claimed in claim 3, wherein the counter circuit includes a first counter that generates the first part of the ODT control signal and a second counter that generates the second part of the ODT control signal, and a latency of the first counter is different from a latency of the second counter.

5. The output circuit as claimed in claim 3, wherein the second part of the ODT control signal is activated during at least the write operation.

6. The output circuit as claimed in claim 1, wherein the second selecting circuit selects one or more driver circuits to be activated out of the plurality of driver circuits, based on the activated ODT selection signal and a code signal for assigning an ODT impedance.

7. The output circuit as claimed in claim 1, wherein at least a part of the plurality of driver circuits is also activated during a data read operation.

8. The output circuit as claimed in claim 1, wherein an ODT impedance can be dynamically changed over between when the semiconductor device carries out a write operation and when other semiconductor device carries out a read operation or the write operation.

9. An output circuit of a semiconductor device that can dynamically change over between ODT impedances of a driver circuit, the output circuit comprising:
   a first selecting circuit that selects any one ODT impedance group out of a plurality of ODT impedance groups;
   a second selecting circuit that selects a predetermined ODT impedance out of the selected ODT impedance group; and
   a synchronizing circuit that is provided between the first selecting circuit and the second selecting circuit and that controls the operation timing of the driver circuit, wherein the first selecting circuit selects one ODT impedance group out of the plurality ODT impedance groups, based on the output of a counter that operates synchronously with the synchronizing circuit.

10. The output circuit as claimed in claim 9, wherein the second selecting circuit selects a predetermined ODT impedance out of the selected ODT impedance group, based on the output of the synchronizing circuit and a code signal for assigning the ODT impedance.

11. The output circuit as claimed in claim 10, wherein the code signal can be changed by a mode register set.

12. The output circuit as claimed in claim 9, wherein the second selecting circuit further selects an output impedance of the driver circuit.

13. The output circuit as claimed in claim 9, wherein the ODT impedance can be dynamically changed over between when the semiconductor device carries out the write operation and when other semiconductor device carries out the read operation or the write operation.

14. A semiconductor device having an output circuit, the output circuit comprising:
    a counter circuit that generates an ODT control signal;
    a plurality of driver circuits having an ODT function;
    a first selecting circuit that activates one of a plurality of ODT selection signals based on the ODT control signal;
    a synchronizing circuit that synchronizes an activated ODT selection signal with a predetermined clock; and
    a second selecting circuit that selects one or more driver circuits to be activated out of the plurality of driver circuits based on the activated ODT selection signal,
wherein the first selecting circuit is provided between the counter circuit and the synchronizing circuit, and the second selecting circuit is provided between the synchronizing circuit and the driver circuit.

15. A data processing system comprising a data processor and a semiconductor memory device, wherein the semiconductor memory device includes an output circuit, the output circuit having:
    a counter circuit that generates an ODT control signal;
    a plurality of driver circuits having an ODT function;
    a first selecting circuit that activates one of a plurality of ODT selection signals based on the ODT control signal;
    a synchronizing circuit that synchronizes an activated ODT selection signal with a predetermined clock; and
    a second selecting circuit that selects one or more driver circuits to be activated out of the plurality of driver circuits based on the activated ODT selection signal,
wherein the first selecting circuit is provided between the counter circuit and the synchronizing circuit, and the second selecting circuit is provided between the synchronizing circuit and the driver circuit.

\* \* \* \* \*